United States Patent [19]

Zupancic et al.

[11] Patent Number: 4,804,721
[45] Date of Patent: Feb. 14, 1989

[54] ETHERS OF THE CONDENSATION PRODUCTS OF PHENOLDICYCLOPENTADIENE ADDUCTS WITH ALDEHYDES AND KETONES AS THERMOSETTING RESINS

[75] Inventors: Joseph J. Zupancic, Bensenville; Jeffrey P. Conrad, Chicago, both of Ill.

[73] Assignee: Allied-Signal Inc., Morristown, N.J.

[21] Appl. No.: 126,378

[22] Filed: Nov. 30, 1987

[51] Int. Cl.$^4$ .......................... C08G 8/36; C08G 8/30; C08G 8/02
[52] U.S. Cl. ..................................... 525/502; 528/126; 528/127; 528/128; 528/152; 528/159; 525/471; 525/480; 525/493
[58] Field of Search ................. 525/502; 528/152, 159, 528/126, 127, 128; 505/471, 480, 493

[56] References Cited

U.S. PATENT DOCUMENTS

| | | | |
|---|---|---|---|
| 2,631,140 | 3/1953 | Bloctt | 528/159 X |
| 2,656,335 | 10/1953 | Bloctt | 528/159 X |
| 2,840,542 | 6/1958 | Freeman et al. | 525/502 X |
| 3,036,138 | 5/1962 | Georges et al. | 260/810 |
| 3,305,522 | 2/1967 | Spacht | 260/45.95 |
| 3,582,516 | 6/1971 | LeBlanc | 525/502 X |
| 3,637,430 | 1/1972 | Dahms et al. | 528/159 X |
| 3,751,375 | 8/1973 | Bender et al. | 260/2.5 BB |
| 3,969,321 | 7/1976 | Kako et al. | 525/502 |
| 4,085,085 | 4/1978 | Tsuchiya et al. | 525/502 X |
| 4,120,847 | 10/1978 | Culbertson | 528/152 X |
| 4,200,706 | 4/1980 | Starks | 525/502 |
| 4,205,145 | 5/1980 | Tsuchiya et al. | 525/502 |
| 4,460,753 | 7/1984 | Yamamoto et al. | 528/159 X |

OTHER PUBLICATIONS

Merck Index, 1983, 10th Edition, pp. 604–605.

Primary Examiner—Howard E. Schain
Attorney, Agent, or Firm—Thomas K. McBride; Eugene I. Snyder

[57] ABSTRACT

The resins resulting from converting the phenol-formaldehyde type condensation products of dicyclopentadiene-phenol adducts with selected aldehydes and ketones to their corresponding vinylbenzyl ethers are an excellent matrix in which to embed fibers to produce a composite. Such resins, especially as a blend of materials with varying molecular weight distribution, are amorphous materials whose glass transition temperature is well under the curing temperature, and whose solubility permits solutions with high solids content so as to afford coatings with high resin content. The extensively crosslinked polymer resulting from thermal, photochemical, or free radical initiated polymerization has excellent thermal and electrical properties for use in multilayer circuit boards.

27 Claims, No Drawings

ETHERS OF THE CONDENSATION PRODUCTS OF PHENOLDICYCLOPENTADIENE ADDUCTS WITH ALDEHYDES AND KETONES AS THERMOSETTING RESINS

BACKGROUND OF THE INVENTION

The subject matter of this application is directed toward resins used in the manufacture of reinforced plastics. More particularly, the resins (binders) are used in the preparation of composites formed from fibers embedded in a polymer resin matrix. Even more specifically this application is directed toward the use of such resins in the preparation of circuit board laminates where the reinforcing material is glass or quartz fiber.

To overcome some mechanical and structural limitations of plastics it has become relatively commonplace to reinforce them with other components. Composites formed of various fibers embedded in a polymer resin matrix are especially useful and susceptible to enormous variation depending upon the nature of the fiber used, how the fiber is utilized, and the matrix or binder for the fibers. Materials which have been used as fibers include glass, quartz, oriented polymers such as the aramids (Kevlar TM), graphite and boron. Whatever their composition such fibers can be used as chopped or continuous filaments, and when used as continuous filaments they can all be unidirectional or woven into a fabric. The matrix can be, for example, a polyester, epoxy, polyimide, polyetherketone or polyetherimide resin as either a thermoset or thermoplastic material. The uses for such composites range from airframes to tennis rackets and from boat hulls to rocket motor casings.

A particular area of composite application is that of printed circuit boards, especially multilayer cirucit boards, for mounting electronic components. The use of glass fabric as the reinforcing material has become more-or-less standard and epoxy resins are most often used as the matrix. For the fiber to exert a reinforcing action it is necessary that the fibers be completely coated with resin, and to achieve this the glass fiber often is surface treated to provide sites for chemical bonding to the resin or to its precursor or for otherwise improved adhesion to the matrix material.

Multilayer circuit boards are laminates with alternating layers of composite and etched copper sheet. A brief discussion of their manufacture will aid in appreciating the properties requisite for such boards. A woven glass fabric is first impregnated with resin by dipping the cloth in a resin solution, often referred to as the varnish solution, in what is called the A-stage. Solvent is then removed to afford a glass cloth reinforced resin, or prepreg, in what is called the B-stage. In some cases the resin in the prepreg may be partially cured, in other cases uncured, but in all cases the prepreg is a non-tacky, readily handled rigid sheet of glass cloth embedded in and coated with a resin. The finished circuit board is prepared by laminating alternating layers of prepreg and etched copper foil under conditions of temperature and pressure where resin is cured, i.e., further polymerized and crosslinked to a final infusible, insoluble stage (C-stage).

From the above brief description some necessary and desirable characteristics of the resin may be readily discerned. The circuit board will be subjected to soldering temperatures and may be operated at an elevated temperature, or experience cyclic locally elevated temperatures because of local power generation, and thus the thermal coefficient of expansion of the resin should approximate that of glass to ensure continued dimensional stability and resistance to heat distortion. The resin should have a high solubility in the varnish solution to ensure high resin loading. The varnish solution should have a sufficiently low viscosity for even coating but not too low a viscosity as to run off the fibers. It is necessary that the prepreg not be tacky so that it can be readily handled and stored. The resin is desirably non-crystalline for enhanced solubility in the varnish solution and for good film forming properties in the prepreg. The resin should have adequate flow at the C-stage so as to make void-free laminated bonds, with the curing temperature somewhat higher than the glass transition temperature ($T_g$) of the resin to afford a wider processing "window." The resin also should be chemically resistant to a corrosive environment and to water vapor. To ensure that the discrete electrical components on a circuit board interact only via the etched path on the copper foil, it is desirable that the matrix have a low dielectric constant and high resistance.

The invention to be described is an amorphous, thermosetting resin which affords a varnish solution of high solids content with a viscosity leading to even coating with runoff, which affords a non-tacky prepreg, has a glass transition temperature sufficiently below the curing temperature to afford an adequate window of processing, and which shows excellent flow properties at the C-stage. The final cured resin exhibits a low dielectric constant and dissipation factor, a low coefficient of thermal expansion, and a high glass transition temperature. In short, we believe our cured resin has properties superior to those currently recognized as industry standards in the lamination of circuit boards, and thus presents outstanding benefits.

It needs to be emphasized that although this application will stress the utilization of the resins of our invention in the production of multilayer circuit boards, the resins may be useful in fabricating composites generally. Consequently, it needs to be explicitly recognized that the resins of our invention are intended for composite manufacture without any limitations other than those imposed by the product specifications themselves.

SUMMARY OF THE INVENTION

The purpose of our invention is to provide thermosetting resins whose properties make them desirable in the preparation of composites, especially in laminated multilayer boards of a glass fiber in a polymer matrix. An embodiment comprises ethers of the condesation product of phenoldicyclopentadiene adducts with certain aldehydes and ketones. In a specific embodiment the ether is a vinylbenzyl ether. In a more specific embodiment the ether is a mixture of vinylbenzyl and alkyl ethers in a ratio of at least 1:1. In a still more specific embodiment at least 80% of the phenolic groups of the product have been converted to the ether. In a yet more specific embodiment the phenol is a cresol. In yet another embodiment the aldehyde is formaldehyde. Other embodiments will be apparent from the following description.

DESCRIPTION OF THE INVENTION

Our invention is a class of thermosetting resins of a vinylbenzyl ether of the condensation product resulting from reaction of a dicyclopentadiene-phenol adduct with certain aldehydes and ketones. In the detailed description which follows we shall first describe the dicyclopentadienephenol adducts, the condensation product of these adducts and suitable aldehydes and ketones, and then the ethers of the condensation products. The thermosetting resins of our invention are these latter ethers. Such a descriptive sequence in fact tracks the preparative route employed for the resins, but it is not intended to imply that such a sequence is mandatory or unique.

The dicyclopentadiene-phenol reaction products, which are adducts or oligomers of a dicyclopentadiene and a phenol, are described in U.S. Pats. Nos. 3,305,522 and 3,751,375; compare 3,036,138. Such products result from the reaction of a dicyclopentadiene with at least one molar proportion of a phenolic compound in the presence of a Friedel-Craft type catalyst and in particular the more potent Friedel-Craft catalysts such as aluminum chloride, zinc chloride, ferrous and ferric chloride and boron trifluoride, as well as complexes based on boron trifluoride. The reaction is conducted at a temperature from 25° to 160° C., preferably between 80° and 150° C. The molar ratio of phenolic compound to dicyclopentadiene employed in the reaction mixture can be varied from 1:1 to at least 5:1 with higher ratios possible but without any beneficial effects. The proportions usually employed range from about 1 to about 4 molar proportions of phenolic compounds per mole of dicyclopentadiene. Over most of this range the proportions of reactants provide for a substantial excess of the phenolic compounds beyond that which will actually react with the dicyclopentadiene. The molar proportions of phenolic compounds which react with dicyclopentadiene usually varies from 1 to 2, with the preferred molar proportion of phenol ranging from 1.5 to 1.75. In some instances it may be desirable to carry out the reaction in an inert organic solvent such as benzene, toluene, etc.

The adducts described above, I, have essentially the formula,

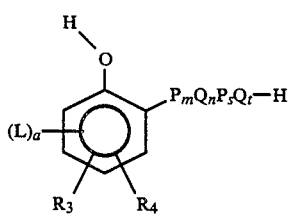

where
P=

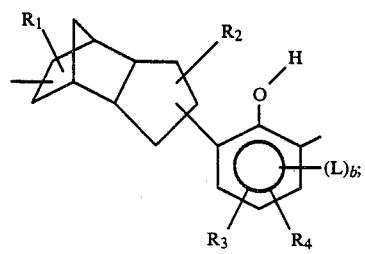

Q=

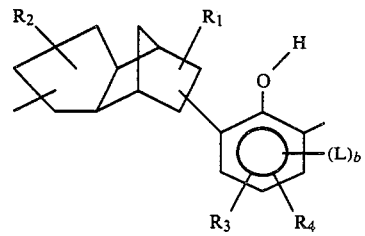

with $R_1$, $R_2$=H or alkyl of 1-10 carbon atoms;
$R_3$=H, alkyl of 1-20 carbon atoms, or aryl;
$R_4$=H or tert-butyl;
L=Br or Cl;
a=0, 1, or 2;
b=0 or 1;
m, n, s, and t are 0 or an integer, and m+n+s+t=z is an integer from 1-10.

The dicyclopentadiene portion can be substituted in either ring. $R_1$ and $R_2$ usually are hydrogen, that is, an unsubstituted dicyclopentadiene is preferred in the practice of this invention, but each of $R_1$ and $R_2$ can be an alkyl group, preferably a primary alkyl group, containing up to about 10 carbon atoms. The lower alkyl groups, such as methyl, ethyl, propyl, and butyl, are especially preferred where the dicyclopentadiene is substituted. Substitution can be at any position of the dicyclopentadiene ring system but is preferred that $R_1$ be at a carbon of the 5-member ring not bonded to the aryl group, and that $R_2$ is at the bridge or bridgehead carbon of the bicyclic ring portion.

The phenolic termini of our resis as well as the phenolic portion of P or Q may be substituted by a saturated hydrocarbon group, a halogen atom, or an alkoxy group. For the condensation with dicyclopentadiene mixtures of such phenols also may be used. Thus, $R_3$ may be an alkyl group containing 1 to about 20 carbon atoms, and those containing up to 10 carbon atoms are preferred in the practice of this invention. Alkyl groups may be primary, secondary, or tertiary. Examples of alkyl groups which may be used in the practice of this invention include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl, with the methyl, ethyl, propyl, and butyl groups, particularly the methyl moiety, being favored. The moiety $R_3$ also may be an aryl group, including substituted aryl groups, especially where the substituent is a lower alkyl group containing up to about 4 carbon atoms. Examples of suitable aryl groups include phenyl, methylphenyl, ethylphenyl, propylphenyl, butylphenyl, naphthyl, and so forth. As previously mentioned, the moiety $R_3$ also may be a halogen atom or an alkoxy group. The phenol also may be unsubstituted, i.e., $R_3$=H. Where a substituent is present it is at a position meta or para to the position bearing the oxygen atom. In fact, a mixture of meta- and para-substituted phenols are preferred in the practice of this invention because such a mixture tends to afford an amorphous resin, which is a beneficial feature, and the case where a mixture of meta- and para-cresols are used to prepare the adduct ($R_3$=m—$CH_3$ and p—$CH_3$) is especially preferred.

The phenolic termini of our resins and the phenolic portion of P or Q also may be substituted by a group, $R_4$, which is hydrogen or a tertiary butyl moiety. In a preferred embodiment of this invention $R_3$ is a lower alkyl group containing up to 4 carbon atoms and at least 5 percent of all $R_4$ are tert-butyl, and it is even more desirable that up to about 25 percent be tert-butyl. In a yet more preferred embodiment, at least 5 percent of all $R_4$ are tert-butyl and $R_3$ is a methyl group, with the variant where up to about 25 percent of $R_4$ are tert-butyl being especially preferred, i.e., $R_4$ is H or a tert-butyl group. The methyl group, $CH_3$, is at a position meta or para to the position bearing the oxygen atom. In fact, a mixture of meta- and para-cresols are preferred in the practice of this invention because such a mixture tends to afford an amorphous resin, which is a beneficial feature.

The basic resins also can be readily modified to be flame retardant by incorporating halogen atoms into the aromatic rings. Thus, L may be a halogen atom, especially bromine, and where the aromatic ring is halogenated a is 0, 1 or 2 and be is 0 or 1. Polyhalogenated materials are desired as flame retardants, which means that a and b are recommended to be maximized. Where the aromatic rings are not halogen substituted then both a and b are 0.

The fragments P and Q are subunits of the adduct. Where the adduct is an oligomer it may be a head-to-head, head-to-tail, or completely or partially random arrangement. Where oligomers are formed they are of relatively low molecular weight. The variables m, n, s, and t each are integers such that z, where z equals m+n+s+t, is an integer from 1 to 10, and usually is up to about 5, with z being 1 or 2 preferred in the practice of our invention. The arrangement of the polymeric subunits may be exemplified by the following. Where are all the subunits are the same, n=s=t=0. Where the subunits alternate, the two simplest cases are m=n=1 and s=t=0, or n=s=1 and m=t=0.

The phenol-dicyclopentadiene adducts I are then reacted with certain aldehydes and ketones to afford a condensation product, II. The reaction occurring is analogous to the well known phenol-formaldehyde condensation to form phenol-formaldehyde resins. In its simplest form this condensation may be represented by the reaction,

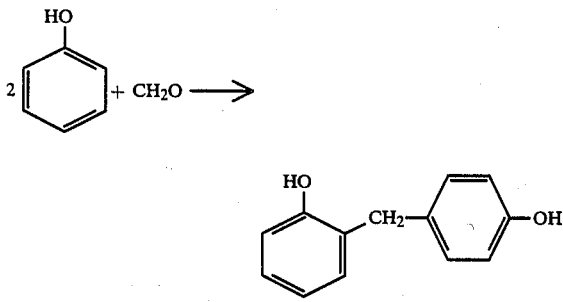

There are many phenolic residues in our adducts available to react or condense with aldehydes and ketones, and therefore a multitude of structurally analogous products may result differing both in the site of the condensation reaction as well as the number of phenolic residues per adduct participating in the condensation reaction. Nonetheless, all of the condensation products are considered within the scope of our invention. Generally the molar ratio of the adduct to the monoaldehyde or ketone with which it is reacted is approximately 2:1, and most usually is not greater than 3:1. This molar ratio is itself is a limitation on the number of products formed, although the number still remains large.

Of the aldehydes used in the condensation with the phenoldicyclopentadiene, adducts I formaldehyde is by far the most important one. Saturated aliphatic aldehydes of formula $C_rH_{2r-1}CHO$ where r is an integer from 1 to 9, and especially from 1 to 5, also may be used in the practice of this invention. Branched alkyl chains in the foregoing aldehydes may be used up to r=5, but unbranched chains are preferred thereafter. Benzaldehyde and substituted benzaldehyde also may be used in the practice of this invention.

Where ketones are used in a condensation reaction with the foregoing adducts the ketones generally are of the formula $CH_3COZ$, where Z is an alkyl or aryl group, and more particularly an alkyl group containing from 1 to 4 carbons. The most commonly employed aryl group will be the parent phenyl group and its substituted analogs. However, more complex aryl groups, such as naphthyl, anthryl, and so forth also may be employed.

Dialdehydes also are usable to afford oligomeric condensation products which result from the reaction of 1 molar proportion of selected dialdehydes with from 3 to about 4 molar proportions of the adduct. Although more than 4 molar proportions of the adduct can be used in the practice of this invention, no practical benefit appears to result therefrom. One class of dialdehydes which may be used are the linear, terminal alkalene dialdehydes of formula $OHC(CH_2)_xCHO$ where x is 0 or an integer from 1 to 6. Such dialdehydes include glyoxal, malondialdehyde, succindialdehyde, glutaraldehyde, adipaldehyde, pimelaldehyde, and sebacaldehyde. Those aldehydes where x is 0–4 are particularly preferred and glyoxal (x=0) is especially favored in the practice of this invention.

Other dialdehydes which may be employed in the preparation of the oligomeric condensation products with the decyclopentadiene-phenol adducts include phthalaldehyde, isophthalaldehyde, terephthalaldehyde, the hexahydrophthalaldehydes (i.e., the reduced counterpoint of the phthalaldehydes where the aromatic ring has been reduced to a cyclohexane ring), cycloheptanedialdehyde, and cyclooctanedialdehyde.

Although generally only a single aldehyde or ketone will be used in the condensation with the adducts I, nonetheless it is possible to use any combination of the aldehydes and ketones given. This leads to condensation products of even greater structural complexity which may be advantageous, at least in selected cases.

The preparation of the condensation products of phenols and aldehydes is well known and need not be described here in great detail. Quite generally, such a condensation is known to be catalyzed by acids generally and Bronsted acids particularly. The particular nature of the Bronsted acid used is not an important feature, and often it is particularly convenient to utilize a strong acid, such as sulfuric acid. Organic sulfonic acids, especially p-toluene sulfonic acid, methane sulfone acid, and trifluoromethyl sulfonic acid, from one general class of strong Bronsted acids usable in the condensation, although other strong acids bearing one or more strongly electron withdrawing groups in close proximity to the carboxyl moiety also are usable. Some examples of the latter include dichloroacetic acid, trichloroacetic acid, difluoroacetic acid, and trifluoroacetic acid.

The phenolic hydroxyls in the condensation product II described above then are capped so as to be converted to ethers, III. At least 80% of the phenolic groups are so capped, and it is desirable that at least 90%, and even more desirable that at least 95%, of the phenolic groups be capped by replacement of the phenolic hydrogens with a group Y. Stated differently, in the formula above less than about 20% of the phenolic hydrogens remain, and desirably less than 10%, even more desirably less than 5%, are present.

The best case results where the ether portion, Y, is vinylbenzyl moiety, that is, of the structure

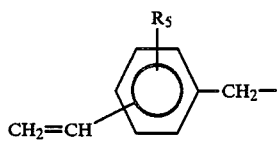

where the vinyl group is either meta or para to the $CH_2$, where $R_5$ is hydrogen, and which usually is a mixture of the meta- and para-isomers. $R_5$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon. As previously indicated $R_4$ usually is hydrogen.

However desirable it may be to have all the phenolic hydroxyls end-capped with vinylbenzyl moieties, there is a decided cost advantage when fewer than all of the other groups are vinylbenzyl, usually at the expense of a somewhat lower dielectric constant. In our invention it is required that at least 50% of the Y moieties be a vinylbenzyl moiety, but a product with better performance characteristics results when from 70 to 100% of the ether groups are vinylbenzyl, and the best product results when 95% to 100% of such groups are vinylbenzyl.

In those cases where less than all of the ether groups are vinylbenzyl, then we are partial to resins where the ether portion Y is an alkyl group containing from 1 to 10 carbons, a cycloalkyl group having 5 to 10 carbons, or a benzyl group. Where Y is an alkyl group, the primary alkyl groups are given priority, especially the primary lower alkyl groups containing from 1 to 4 carbon atoms. Thus, the most desirable alkyl groups consist of methyl, ethyl, 1-propyl, 1-butyl, and 2-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl forth. However, it is to be emphasized that a benzyl group also operates quite satisfactorily in the practice of our invention. The most common cycloalkyl groups used in our invention are 5- and 6-membered cycloalkanes, unsubstituted or alkyl substituted so as to contain 5 to 10 carbon atoms. Examples are cyclopentyl, cyclohexyl, methylcyclopentyl, dimethylcyclopentyl, ethylcyclopentyl, propylcyclopentyl, butylcyclopentyl, pentylcyclopentyl, ethylmethylcyclopentyl, methylpropylcyclopentyl, butylmethylcyclopentyl, methylcyclohexyl, dimethylcyclohexyl, ethylcyclohexyl, propylcyclohexyl, butylcyclohexyl, and so forth. The 1-propyl group is an especially desirable alternative to the vinylbenzyl moiety, and resins where less than 5% of the phenolic hydrogens remain with the ether moieties being vinylbenzyl or 1-propyl in a ratio of 1.1:1 to about 6:1 are highly recommended.

The ethers III of this invention may be prepared by any convenient method known in the art. However, they are most readily prepared by reacting a vinylbenzyl halide with the aldehyde/ketone condensation product of the dicyclopentadiene-phenol adduct in a basic solution. Generally a mixture of the meta- and para-isomers of vinylbenzyl chloride are used, although the bromide and, to a lesser extent, the iodide also may be used. The reaction may be conveniently performed in an alcoholic potassium hydroxide solution, often containing acetone, N-methylpyrrolidone, or some other organic cosolvent, at the reflux temperature. Where some of the ether moieties are alkyl, cycloalkyl, or benzyl moieties these may be prepared by reacting a suitable alkyl, cycloalkyl, or benzyl halide with a partially vinylbenzyl end-capped adduct, or by reacting the uncapped adduct with a mixture of halides.

A mixture of thermosetting resins of the foregoing description frequently is used in the preparation of composites. The use of a mixture tends to promote formation of an amorphous resin which is desirable both in increasing the solubility of the resin in a varnish solution, in promoting good film-forming qualities, and in providing a stable, non-flaking coating in the prepreg stage. A desirable mixture of resins III is one which arises from a mixture of adducts I having about 15 to about 40% by weight of I where $z=1$, about 10 to about 30% with $z=2$, about 5 to about 20% with $z=3$, about 5 to about 20% with $z=4$, and about 5 to about 20% with $z=5$–10.

The appended vinyl groups are readily crosslinked in a curing step effected by thermal, chemical, or radiative means. Thermal curing is generally done in the temperature range between about 110° and about 250° C., and in practice multilayer boards may be laminated at a temperature between about 150° and about 200° C. for 0.5–5 hours with post curing at about 180°–250° C. for about 0.5–24 hours. Curing also may be brought about using a free radical initiator, such as azo-bis-isobutyronitrile, benzoyl, peroxide, di-t-butyl peroxide, etc. Curing may be effected as well as by irradiation, especially by visible and ultraviolet light in the presence of a suitable photoinitiator. Whether thermal, chemical, or photochemical curing is performed, the resin becomes extensively crosslinked and sets to an infusible, insoluble glassy solid.

The materials of our invention also can be blended with other types of vinylbenzyl ethers of functionality greater than or equal to 2 to provide A-stage varnish solutions with tailorable viscosity and variable properties in the cured product such as glass transition temperature, heat distortion temperature, fracture toughness, etc. For example, our resins could be blended with various vinyl benzyl bisphenols or styrenated bisphenols to raise crosslink density and improve processability of the bis-styrl compound. The materials of our invention are polymers of moderate functionality (i.e., number of vinylbenzyl groups per molecule) and viscosity and they can be incorporated to reduce crystallinity of various styrenated bisphenols where the bisphenols are exemplified by the formula

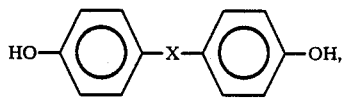

with X being —O—, —C(CH$_3$)$_2$—, —SO$_2$—, —O—, —CO—, and so forth to raise the resin solids content in the A-stage varnish solution, to raise the resin content in the B-stage, and to reduce the amount of resin flow in the C-stage. High-to-moderate molecular weight polyvinylbenzyl ethers) also may be useful for improving the shelf-life of other styrenated oligomers, and may raise the ductility of the otherwise brittle laminate, such as in the case of styrenated bisphenol A. Our materials also can be blended with various halogenated resins to obtain, after curing, a polymer with increased flame retardancy. The foregoing blends are merely illustrative of those which can be employed in our invention and all are intended to be encompassed thereunder.

The following examples are only illustrative of this invention. Materials used therein are to be construed as only representative of those which can be used in the practice of our invention, and are not a limitation of the invention as claimed.

EXAMPLE I

Styrene termination-alkylation of m-cresol-dicyclopentadiene-formaldehyde. (70% Vinylbenzyl/30%-propyl) (STCDPF (70 VBz/30 Pr)). To a 2 liter three necked round bottom flask fitted with mechanical stirring shaft, reflux condenser and pressure equalizing dropping funnel was charged 320 mL of 1-methyl-2-pyrrolidinone, 0.68 g of BHT, 125.0 g of m-cresol-dicyclopentadiene-formaldehyde (obtained from Borden Chemical Co.) ($M_n$=604, $M_w$=2970 and dispersity 4.92) and 82.34 g of vinylbenzylchloride. The reaction solution was brought to 60° C. with stirring with the aid of a water bath and then 80 mL of an ~9 molal solution of KOH in methanol was added dropwise over a 30 minute interval. The mixture was maintained at 60° C. with stirring for an additional 4.5 hours. 44.24 g of 1-bromopropane in 200 mL of 1-methyl-2-pyrrolidinone was added to the reaction solution. 50 mL of ~9 molal KOH in methanol was then added dropwise over 30 minutes. The reaction was kept at 60° C. an additional 100 minutes and then allowed to cool to room temperature. 350 mL of toluene was added to the reaction mixture and the mixture transferred to a separatory funnel and washed with 3×900 mL of water. The organic phase was dried over sodium sulfate, slurried with celite and filtered through a glass frit, and the resin was isolated by removal of the solvent under vacuum ($M_n$=674, $M_w$=3040, dispersity 4.51).

The resin demonstrated the following properties: $T_{polymerization}$(onset), 102° C.; $T_{polymerization}$(peak), 151° C.; $\Delta H_{polymerization}$, 88J/g; and Gel time @170° C., 19 sec.

The resin was dissolved in toluene (20.0 g resin/15mL toluene) and cured via the following cure cycle: 2 hours at 80° C., 16 hours at 100° C., 4 hours at 120° C., 16 hours at 160° C., 2 hours at 200° C. and 1 hour at 225° C. The cured polymer possessed the following properties as shown in Table 1.

TABLE 1

| Tg (°C.)$^a$ DSC | Tsp (°C.)$^b$ TMA | $\alpha_g^e$ (ppm/°C.) | $\alpha_{260}^f$ (ppm/°C.) | ε'/tanδ$^e$ 0% RH$^f$ | ε'/tanδ$^e$ 50% RH | H$_2$O$^6$ absorption (wt %) |
|---|---|---|---|---|---|---|
| 300 | 149 | 62 | 111 | 2.61/0.004 | 2.62/0.021 | 0.071 |

$^a$Glass transition temperature.
$^b$Softening point.
$^c$Coefficient of thermal expansion from 25° C. to T$_{sp}$
$^d$Coefficient of thermal expansion from 25° C. to 260° C.
$^e$ε' is the dielectric constant, tanδ the dissipation factor, measured at 1 MHz, 25° C., two-fluid cell.
$^f$Relative humidity.
$^g$Weight gain after two weeks at 50% relative humidity.

EXAMPLE II

Copolymers of STCDPF (70VB$_z$/30 Pr) and styrene terminated bromo-substituted tetrakisphenol ethane (STBTPE) [70VB$_z$/30 Pr]. Mixtures of STCDPF of Example I and STBTPE (70VB$_z$/30 Pr) were prepared. Blends of these thermosetting resins were cured as described in the preceding example using toluene as the solvent. Analysis of the copolymer resulting from these blends disclose the following properties as collated in Table 2 below.

TABLE 2

| STBCDP wt (g) | STBTPE wt (g) | Tg (°C.)$^a$ DSC | Tsp (°C.)$^b$ TMA | $\alpha_g^e$ (ppm/°C.) | $\alpha_{260}^f$ (ppm/°C.) | ε'/tanδ$^e$ 0% RH$^f$ | ε'/tanδ$^e$ 50% RH | H$_2$O$^g$ absorption (wt %) |
|---|---|---|---|---|---|---|---|---|
| 10.14 | 10.17 | >300 | 146 | 65 | 93 | 2.78 | 2.89 | — |

$^a$Glass transition temperature.
$^b$Softening point.
$^c$Coefficient of thermal expansion from 25° C. to Tsp.
$^d$Coefficient of thermal expansion from 25° C. to 260° C.
$^e$ε' is the dielectric constant, tanδ the dissipation factor, measured at 1 MHz, 25° C., two-fluid cell.
$^f$Relative humidity.
$^g$Weight gain after two weeks at 50% relative humidity.

What is claimed is:

1. A thermosetting resin comprising ethers of the condensation product of at least one aldehyde or ketone with the adduct of a dicyclopentadiene and phenol, said adduct having essentially the formula

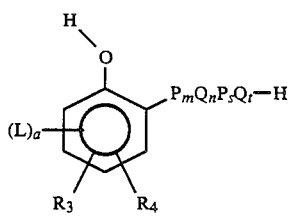

where
P=

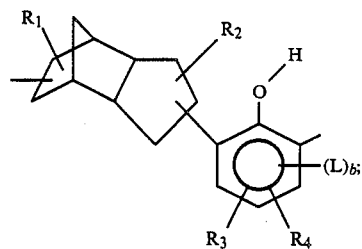

Q=

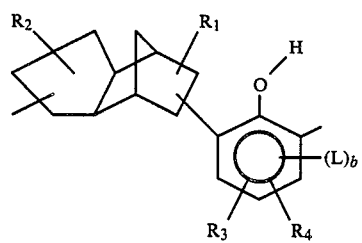

where
$R_1$ and $R_2$ are independently selected from the group consisting of hydrogen or an alkyl moiety containing from 1 to about 10 carbon atoms;
$R_3$ is selected from the group consisting of alkyl moieties containing from 1 to about 20 carbon atoms and is located at a position meta or para to the position of the oxygen on the aromatic ring;
$R_4$ is hydrogen or a tertiary butyl moiety;
m, n, s and t each are 0 or an integer and whose sum is z, where z is 1–10;
a is 0, 1, or 2;
b is 0 or 1; and
L is Cl or Br;
where the aldehyde is selected from the group consisting of formaldehyde, saturated aldehydes of formula $C_rH_{2r+1}CHO$, with r being an integer from 1 to about 9, benzaldehydes, ketones of the formula $CH_3COZ$, where Z is an alkyl group containing 1 to 4 carbons or an aryl group, and dialdehydes of formula $OHC(CH_2)_xCHO$, where x is an integer from 2 to about 8; and where at least 80% of the phenolic hydrogens are replaced by a moiety Y, where Y is selected from the group consisting of hydrogen, the vinylbenzyl moiety,

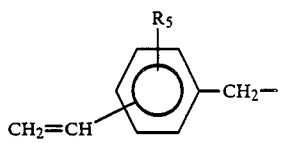

alkyl moieties containing 1 to 10 carbon atoms, cycloalkyl moieties having 5 to 10 carbon atoms, or benzyl, subject to the constraints (a) at least 50% of all Y's are the vinylbenzyl moiety, (b) the vinyl group is para or meta to the benzylic group, and (c) $R_5$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon.

2. The resin of claim 1 wherein $R_1$ and $R_2$ are hydrogen.

3. The resin of claim 1 where $R_3$ is a methyl, ethyl, propyl, or butyl group.

4. The resin of claim 1 where $R_3$ is a methyl group.

5. The resin of claim 1 where z is an integer from 1 to 5.

6. The resin of claim 5 where z is 1 or 2.

7. The resin of claim 1 where Y is a m- or p-vinylbenzyl moiety.

8. The resin of claim 1 where $R_1$ and $R_2$ are lower alkyl groups from 1 to about 4 carbon atoms.

9. The resin of claim 1 where L is bromine.

10. The resin of claim 1 where fewer than 5% of phenolic hydrogens remain and Y is a vinylbenzyl moiety or a linear alkyl moiety having 1 to 4 carbon atoms, with the ratio of the vinylbenzyl to alkyl moieties ranging from 1.1:1 to about 6:1.

11. The resin of claim 3 where at least 5 percent of all $R_4$ is a tertiary butyl moiety.

12. The resin of claim 11 where up to about 25 percent of all $R_4$ is a tertiary butyl moiety.

13. The resin of claim 1 where $R_3$ is methyl, at least 5 and up to about 25 percent of all $R_4$ is a tertiary butyl moiety, fewer than 5% of phenolic hydrogens remain and Y is a vinylbenzyl moiety or linear alkyl moiety having 1 to 4 carbon atoms, with the ratio of vinylbenzyl to alkyl moieties ranging from 1.1:1 to about 6:1.

14. The resin of claim 1 where fewer than 20% of phenolic hydrogens remain and Y is the vinylbenzyl moiety.

15. The resin of claim 1 where the aldehyde is formaldehyde.

16. A mixture of thermosetting resins comprising ethers of the condensation product at least one aldehyde or ketone with the adduct of a dicyclopentadiene and a phenol, said adduct having essentially the formula

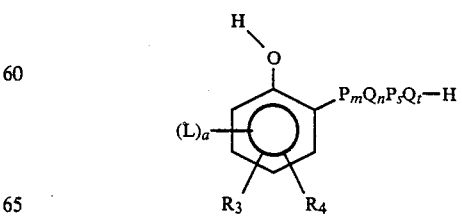

where
P=

Q=

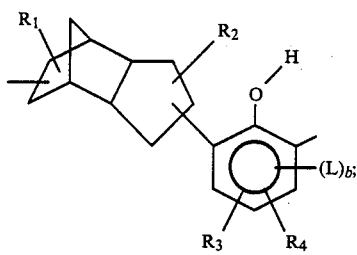

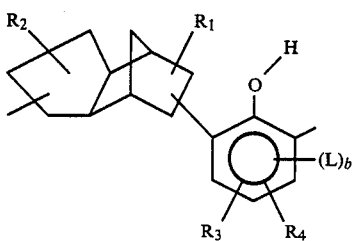

where
each of $R_1$ and $R_2$ is hydrogen or an alkyl group containing from 1 to about 10 carbon atoms;
$R_3$ is selected from the group consisting of alkyl moieties containing from 1 to about 20 carbon atoms and is located at a position meta or para to the position of the oxygen on the aromatic ring;
$R_4$ is hydrogen or a tert-butyl moiety;
m, n, s, and t each are integers whose sum is z and where z is an integer from 0-10, and from about 15 to about 40% have z=1, from about 10 to about 30% have z=2, from about 5 to about 20% have z=3, from about 5 to about 20% have z=4, and from about 5 to about 20% have z=5-10.
a is 0, 1, or 2;
b is 0 or 1; and
L is Cl or Br;
where the aldehyde is selected from the group consisting of formaldehyde saturated aldehydes of formula $C_rH_{2r+1}CHO$, with r being an integer from 1 to about 9, benzaldehydes, ketones of the formula $CH_3COZ$, where Z is an alkyl group containing 1 to 4 carbons or an aryl group, and dialdehydes of formula $OCH(CH_2)_xCHO$, where x is an integer from 2 to about 8; and where at least 80% of the phenolic hydrogens are replaced by a moiety Y, where Y is selected from the group consisting of the vinylbenzyl moiety

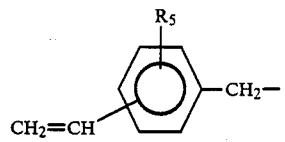

hydrogen, alkyl moieties containing 1 to 10 carbon atoms, cycloalkyl moieties having 5 to 10 carbon atoms, or benzyl subject to the constraints (a) at least 50% of all Y's are the vinylbenzyl moiety, (b) the vinyl group is para or meta to the benzyl group, and (c) $R_5$ is a chemically inert substituent selected from the group consisting of hydrogen, and alkyl or alkoxyl moiety containing 1 to about 10 carbon atoms, a halogen, and monovalent radicals whose parent is an aromatic hydrocarbon.

17. The mixture of claim 16 where $R_1$ and $R_2$ are hydrogen.

18. The mixture of claim 16 where $R_1$ and $R_2$ are lower alkyl groups from 1 to about 4 carbon atoms.

19. The mixture of claim 16 where $R_3$ is a methyl group.

20. The mixture of claim 16 where Y is a m- or p-vinylbenzyl moiety.

21. The mixture of claim 16 where $R_3$ is a methyl group, at least 5 and up to about 6 to about 25 percent of all $R_4$ is a tertiary butyl moiety, fewer than 5% of phenolic hydrogens remain and Y is a vinylbenzyl moiety or linear alkyl moiety having 1 to 4 carbon atoms, with the ratio of vinylbenzyl to alkyl moieties ranging from 1.1:1 to about 6:1.

22. The mixture of claim 16 where fewer than 5% of phenolic hydrogens remain and Y is a vinylbenzyl or a primary alkyl moiety having 1 to 4 carbon atoms, and the ratio of a vinylbenzyl to alkyl moieties ranges from 1.1:1 to about 6:1.

23. The polymer resulting from curing the resin of claim 1.

24. The polymer of claim 23 where curing is done thermally.

25. The polymer of claim 23 where curing is performed photochemically.

26. The polymer of claim 23 where the resin has been cured with the aid of a free radical initiator.

27. The polymer resulting from curing the mixture of claim 16.

* * * * *

UNITED STATES PATENT AND TRADEMARK OFFICE
CERTIFICATE OF CORRECTION

PATENT NO. : 4,804,721
DATED : February 14, 1989
INVENTOR(S) : Joseph J. Zupancic and Jeffrey P. Conrad It is certified that error appears in the above-identified patent and that said Letters Patent is hereby corrected as shown below:

Column 3, line 63: "$(L)_b$:" should read -- $(L)_b$ --.
Column 4, line 29: after "but" insert -- it --.
Column 6, line 1: after "ratio" delete [is].
Column 7, line 11: after "is" insert -- a --;
 line 53: after "1-butyl" insert -- , 2,3-dimethyl-1-butyl, 3,3-dimethyl-1-butyl, 2-methyl-1-pentyl, and so --.
Column 8, line 45: after "benzoyl" delete [,].
 line 46: after "well" delete [as].
Column 9, line 12: "vinylbenzyl " should read -- (vinylbenzyl --.
Column 11, line 21: "$(L)_b$:" should read -- $(L)_b$ --;
 line 59: "$C_rH_2r+1CHO$" should read -- $C_rH_{2r+1}CHO$ --
Column 12, line 20: "wherein" should read -- where --;
 line 54: after "product" insert -- of --.
Column 13, line 8: "$(L)_b$:" should read -- $(L)_b$ --;
 line 44: after "formaldehyde" insert -- , --;
 line 45: "$C_rH_2r+1CHO$" should read -- $C_rH_{2r+1}CHO$ --.
Column 14, line 16: "$R_5$is" should read -- $R_5$ is --;
 line 17: "and" should read -- an --.

Signed and Sealed this

Fifteenth Day of August, 1989

Attest:

DONALD J. QUIGG

Attesting Officer

Commissioner of Patents and Trademarks